United States Patent [19]
Nishizawa

[11] Patent Number: 5,741,579
[45] Date of Patent: Apr. 21, 1998

[54] HEAT-CONDUCTIVE SHEET

[75] Inventor: Koji Nishizawa, Nagano-ken, Japan

[73] Assignee: Shin-Etsu Polymer Co., Ltd., Tokyo, Japan

[21] Appl. No.: 633,495

[22] Filed: Apr. 16, 1996

[30] Foreign Application Priority Data

Apr. 28, 1995 [JP] Japan .................................. 7-106271

[51] Int. Cl.$^6$ .............................. B32B 7/02; H01L 23/34
[52] U.S. Cl. .......................... 428/215; 428/214; 428/332; 428/447; 428/450
[58] Field of Search ................... 428/214, 215, 428/332, 447, 450

[56] References Cited

U.S. PATENT DOCUMENTS 5,221,575   6/1993   Nakano et al. ........................ 428/323

Primary Examiner—D. S. Nakarani
Attorney, Agent, or Firm—McAulay Fisher Nissen Goldberg & Kiel, LLP

[57] ABSTRACT

Proposed is a novel heat-conductive sheet used for the transfer of heat from a heat-generating device, e.g., semiconductor devices, to a heat sink member mounted thereon by intervening therebetween. The heat-conductive sheet is a laminar body comprising an aluminum foil and a layer of a gel-like composite material consisting of a cured organopolysiloxane as the matrix phase and inorganic heat-conductive particles as the dispersed phase in the matrix. The gel-like heat-conductive layer is specified by a specific heat conductivity in the range from 0.001 to 0.005 calorie/cm·second·°C. and a specific consistency defined by the value of the ¼-cone penetration in the range from 10 to 80 (×1/10 mm) at 25° C. according to JIS K 2920.

5 Claims, 5 Drawing Sheets

HEAT-CONDUCTIVE SHEET

BACKGROUND OF THE INVENTION

The present invention relates to a heat-conductive sheet or, more particularly, to a heat-conductive composite sheet which is interposed between a heat-generating electronic device such as ICs, LSIs, CPUs and the like in an information-processing instrument and a heat-radiating member or heat sink member from which the heat generated in the device is dissipated efficiently to the ambience with an object to increase the efficiency of heat dissipation.

It is a remarkable trend in recent years that many of information-processing instruments such as computers, word processors and the like are designed to have a decreasingly small thickness in order to ensure portability of the instrument. On the other hand, the power consumption in these information-processing instruments is rather increasing along with upgrading of the performance of the instrument so that it is not rare that the power consumption of some of semiconductor devices exceeds 2 watts. It is therefore an indispensable measure to be undertaken that such a power consuming semiconductor device is provided with an efficient heat-dissipating means because otherwise the temperature of the device is gradually increased during continued running of the instrument resulting in a decrease in the performance of the instrument as a whole. Various methods have been proposed heretofore and actually practiced including a heat sink member in a direct contact with the surface of the semiconductor device, a layer of a grease or a grease-like material intervening between the surface of the semiconductor device and the heat sink member so as to enhance heat transfer by conduction therebetween and a heat-conductive sheet member of, for example, a heat-conductive rubber which is sandwiched between the surface of the semiconductor device and the heat sink member also to enhance heat transfer by conduction therebetween relying on the intimacy of contacting between surfaces.

Each of the above described method for the direct or indirect heat transfer from the semiconductor device to the heat sink member has its own problems and disadvantages. For example, the method of direct heat transfer from a semiconductor device to a heat sink member sometimes causes mechanical damage of the semiconductor device when the heat sink member is made from a rigid material if not to mention that contacting therebetween cannot be intimate enough because both of the semiconductor device and the heat sink member are made from a rigid material so that direct contacting therebetween inherently cannot be other than a point contact not to give a high efficiency of heat transfer by conduction. The method relying on the intervention of a grease layer has a problem because it is a rather difficult matter to ensure uniformity and constancy of the condition of the grease layer as a consequence of the consistency of the grease depending on the temperature and the conditions for the control of the coating machine if not to mention that the heat sink member must be pressed under a substantial force against the surface of the device to ensure good heat conduction. The method of indirect heat transfer by the use of a rubber-made heat-conductive sheet is also not free from the disadvantage of insufficient heat transfer between the surface of the device and the heat sink member unless the heat sink member is pressed strongly to the surface of the device in order for contacting not to be a point contact.

SUMMARY OF THE INVENTION

The present invention accordingly has an object, in view of the above described problems and disadvantages, to provide a novel and improved heat-conductive sheet which is used by intervening between the surface of a heat-generating semiconductor device and a heat sink member with an object to increase the efficiency of heat transfer therebetween by heat conduction therethrough keeping a good and intimate contacting condition with the surfaces of both of the semiconductor device and the heat sink member without the risk of damaging the semiconductor device.

Thus, the heat-conductive sheet provided by the invention is a composite laminar body which comprises:

(A) a substrate sheet of a material having a heat conductivity of at least 0.001 calorie/cm·second·°C. such as a foil of aluminum or an aluminum alloy as a substrate; and (B) a deformable layer of a composite material having a thickness in the range from 0.005 to 1.0 mm formed on at least one surface of the foil, the composite material consisting of (a) a gelled organopolysioxane forming the matrix phase and (b) particles of a heat-conducting powder as the dispersed phase in the matrix phase and the composite material having a heat conductivity in the range from 0.001 to 0.005 calorie/cm·second·°C. and a consistency given by the ¼-cone penetration in the range from 10 to 80 (×⅒ mm) at 25° C. as determined by the procedure specified in JIS K 2220.

DETAILED DESCRIPTION OF THE PREFERRED EMBODIMENTS

Figure 1A:
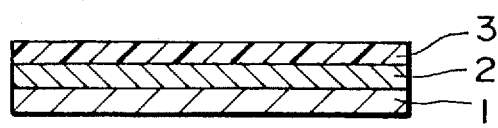
FIGS. 1A and 1B are each a vertical cross sectional view of the single-sided and double-sided heat-conductive sheets having one or two layers of the gelled silicone composition on one or both of the substrate surfaces, respectively, according to the invention.
Figure 1B:
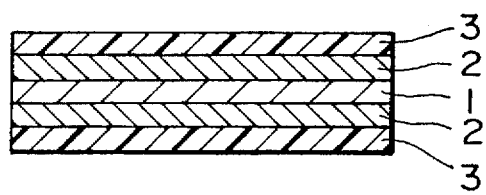

In the following, the heat-conductive sheet of the invention is described in more detail by making reference to the accompanying drawing, in which FIGS. 1A and 1B are each a vertical cross sectional view of a single-sided and a double-sided heat-conductive sheet, respectively, according to the invention. The composite heat-conductive sheet illustrated in FIG. 1A consists of a substrate 1 and a deformable heat-conductive layer 2 of a gelled silicone-based composition on one of the surfaces of the substrate 1. The substrate 1 is a sheet made from a material having a heat conductivity of at least 0.001 calorie/cm·second·°C. such as a foil of aluminum or an alloy mainly consisting of aluminum although other materials such as a rubber film impregnated with a relatively large amount of a heat-conductive filler can also be used and the deformable layer 2 is formed on one surface alone of the substrate 1 while the composite heat-conductive sheet illustrated in FIG. 1B consists of a substrate 1 and two deformable heat-conductive layers 2,2 each formed on one of the surfaces of the substrate 1. The layer 3 or layers 3,3 are each a releasable protective film of, usually, a plastic resin for temporary protection of the deformable layers 2,2 during handling and transportation of the products, which must be removed from the heat-conductive sheet just before use thereof.

These three-layered and five-layered structures including a releasable proective sheet 3 or sheets 3,3 can be obtained in several different ways. For example, firstly, a foil of aluminum 1 is coated with a silicone-based composite material before curing to form a gel and containing heat-conductive fine particles on one or both of the surfaces of the aluminum foil 1 in a specified coating thickness of 0.05 to 1.0 mm followed by lamination with a releasable plastic film 3 or films 3,3 and curing of the composite material therebetween to give a deformable layer 2 or layers 2,2. Secondly, a releasable plastic film 3 is coated with the uncured silicone-based composite material before gelation in a specified thickness and an aluminum foil 1 is press-contacted to the composite-coated plastic film to form a three-layered structure which is subjected to curing of the silicone. When a five-layered structure of FIG. 1B is desired, an aluminum foil 1 is sandwiched between two of the composite-coated plastic films 3,3 with the composite layers 2,2 each intervening between the aluminum foil 1 and one of the plastic films 3,3 followed by curing of the silicone. Further alternatively, each of an aluminum foil 1 and a releasable plastic film 3 is coated on one surface with the silicone-based composite material before curing to form a coating layer 2 and they are bonded together by bringing the coated surface of the plastic film 3 into contact with the uncoated surface of the aluminum foil 1. Thereafter, another plastic film 3 is brought into contact with the exposed coating layer 2 on the surface of the aluminum foil 1 to form a five-layered structure followed by curing of the silicone-based composite material.

As is mentioned above, the substrate 1 of the inventive heat-conducting sheet is made, though not limitative, from aluminum or an aluminum-based alloy which is selected, preferably, from those having a heat conductivity of at least 0.1 calorie/cm·second·°C. in order to minimize temperature elevation of the semiconductor device with application of the heat-conducting sheet not to exceed, for example, 80° C. Although several other metals and alloys satisfy the above mentioned requirement for the heat conductivity including copper, iron and the like as a relatively inexpensive industrial material, aluminum or an aluminum-based alloy is preferred to other metals and alloys in respect of several advantageous properties. For example, a copper foil is more susceptible to oxidation by the atmospheric oxygen and is less resistant against formation of creases under the influences of external stress in the process of foil making. Needless to say, use of a creased foil is undesirable because the contacting therewith is necessarily in a state of point contact if not to mention that uni-formity of coating cannot be ensured thereon. Iron and stainless steel are undesirable in respect of the low workability in foil making and in respect of the larger weight than aluminum.

The foil of aluminum or an aluminum-based alloy should have a thickness in the range from 0.03 to 0.20 mm or, preferably, from 0.05 to 0.10 mm. When the thickness is too small, the foil cannot be mechanically strong enough to cause breaking or deformation in the working process while, when the thickness is too large, a decrease is caused in the efficiency of mechanical working in addition to the increase in the weight.

The deformable layer 2 of a composite material is formed from a composition comprising a curable organopolysiloxane compound which can be converted into a gel-like form by curing as a matrix phase and fine particles of an inorganic material having good thermal conductivity as a dispersed phase. The thermally conductive inorganic material is exemplified by alumina, titanium dioxide, boron nitride and the like though not limitative thereto. The inorganic material and the compounding amount thereof in the organopolysiloxane should be selected in consideration of the balance between the heat conductivity and consistency of the composition after curing expressed by the value of cone penetration. For example, the composition after curing should have a heat conductivity in the range from 0.001 to 0.005 calorie/cm·second·°C. and a ¼-cone penetration in the range from 10 to 80 (×⅒ mm) as determined by the method specified in JIS K 2220.

When the heat conductivity of the composite material forming the layer 2 on the aluminum foil 1 is too low, the heat conducting effect cannot be as high as desired. Although a heat conductivity to exceed the above mentioned upper limit has no particular disadvantages in itself, such a high heat conductivity can be obtained only by unduly increasing the compounding amount of the inorganic heat-conducting powder in the organopolysiloxane composition so that the cone penetration of the layer 2 after curing of the composition is necessarily decreased to be smaller than 10 (×⅒ mm) resulting in a problem that the surface of the deformable layer 2 has low adaptability to the surface of a heat sink member or semiconductor device having ruggedness to cause an increased resistance against heat transfer through the interface therebetween. On the other hand, the ¼-cone penetration of the composition after curing cannot exceed 80 (×⅒ mm) unless the compounding amount of the inorganic powder is unduly decreased so as not to give the desirable heat conductivity of the layer 2.

The deformable layer 2 of the gelled organopolysiloxane composition has a thickness in the range from 0.05 to 0.10 mm. When the thickness of the deformable layer 2 is too small, the heat conductive sheet would have poor adaptability to the surface of a heat sink member or semiconductor device to cause an increase in the resistance against heat transfer. When the thickness thereof is too large, on the other hand, the layer 2 may act as a barrier against flow of heat therethrough. When the heat-conductive sheet has two deformable layers 2,2 of the gelled silicone-based composition on both surfaces of the aluminum foil 1 as is illustrated in FIG. 1B, it is preferable that the overall thickness of the heat-conductive sheet having the three-layered structure does not exceed 0.30 mm.

The heat-conductive sheet of the invention having the above described structure and properties of the respective layers can be bonded with intimate contact to the surface of a heat sink member or semiconductor device by virtue of the appropriate adherence and deformability of the layer 2 formed from a gelled silicone-based composition.

Since the surface of the deformable layer 2 has stickiness, it is unavoidable that dust particles are deposited on the sticky surface if the surface is kept exposed to open atmosphere. It is therefore advantageous that the sticky surface of the layer 2 is temporarily protected by attaching a releasable plastic film 3 which is removed by peeling just before use of the heat-conductive sheet. A heat-conductive sheet of a continuous length having releasable protective plastic films 3,3 on both surfaces can be wound around a core mandrel in the form of a roll for storage and transportation and the sheet is unrolled and cut in an adequate unit length before use.

The process for the manufacture of the inventive heat-conductive sheet can be conventional. For example, a continuous-length aluminum foil 1 in the form of a roll is continuously unrolled from the roll and coated with a silane coupling agent as a primer by spraying followed by drying in a tunnel oven. Then, the primer-treated aluminum foil is coated continuously with a silicone-based curable composition containing the inorganic powder in a specified thickness followed by curing in a curing oven to give a deformable layer 2 on the surface of the aluminum foil 1. The surface of the deformable layer 2 is protected by laminating a releasable plastic film 3. If desired, the thus prepared sheet is slitted into ribbons or tapes of a desired width, each of which is wound in the form of a roll suitable for handling and transportation.

In the following, the heat-conductive sheet of the present invention is described in more detail by way of examples.

EXAMPLE 1

A silicone-based composition having a viscosity of 200 poise at 25° C. was prepared by uniformly blending an organopolysiloxane curable into a gel-like form by the hydrosilation reaction (KE 104GEL, a product by Shin-Etsu Chemical Co.) and 50% by weight of an alumina powder. The composition could be gelled by heating to give a gel-like composition having a heat conductivity of 0.0025 calorie/cm·second·°C. and a ¼-cone penetration of 30 (×⅒ mm). Separately, a 300 mm by 300 mm wide square aluminum foil having a thickness of 0.05 mm was coated on both surfaces with a silane coupling agent (KBM 403, a product by Shin-Etsu Chemical Co.) as a primer followed by drying at 150° C. for 3 minutes.

A polyester film having a thickness of 0.05 mm after coating on one surface with a surface active agent to serve as a releasable plastic film followed by drying was coated on the surfactant-treated surface with the above prepared silicone-based composition in a thickness of 0.075 mm by the method of screen printing on a screen printing machine equipped with a 100 mesh screen.

Two of the above prepared releasable polyester films were each applied and bonded to the primer-treated surfaces of the aluminum foil at the layer of the silicone composition followed by a heat treatment at 120° C. for 15 minutes to effect curing of the silicone composition into a gel-like form giving a five-layered structure as shown in FIG. 1B. The thus obtained heat-conductive sheet having releasable films was cut into square pieces of 20 mm by 20 mm wide.

EXAMPLE 2

A continuous-length aluminum foil having a thickness of 0.05 mm and a width of 300 mm in a roll was unrolled from the roll at a velocity of 5 meters/minute and coated continuously on one surface with the same silane coupling agent as used in Example 1 followed by drying in a drying oven. The aluminum foil was then coated on the thus primer-treated surface with the same alumina-loaded silicone composition as used in Example 1 in a thickness of 0.075 mm followed by curing of the silicone to effect adhesive bonding between the aluminum foil and the layer of the cured silicone composition. A continuous-length polyester film having a thickness of 0.05 mm was unrolled from a roll and, after a surface treatment with a releasing agent, was laminated with the above prepared double-layered heat-conductive sheet on the surface of the cured silicone composition as a releasable plastic film.

The same coating and laminating procedure as described above was repeated on the other surface of the aluminum foil so that a five-layered structure of the heat-conductive sheet protected on both surfaces with releasable films as is illustrated in FIG. 1B was obtained in a continuous length, which was slitted into tapes of 20 mm width and the tape was incised at 20 mm intervals leaving one of the polyester films uncut before each of the tapes as a continuum of 20 mm by 20 mm square pieces of the heat-conductive sheet connected by the polyester film was wound into a roll.

Testing Example

Figure 2A:
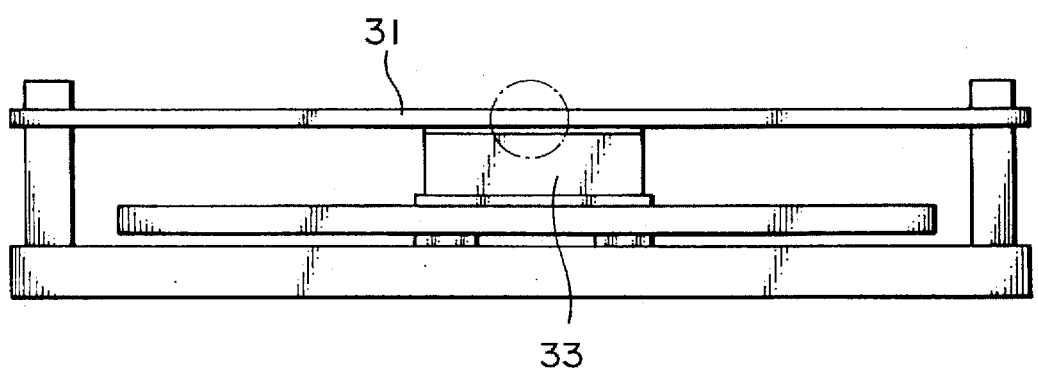
FIG. 2A is a schematic front view of the testing instrument for the measurement of the heat-conducting performance of a model heater and FIG. 2B is an enlargement of the encircled part in FIG. 2A.
Figure 2B:
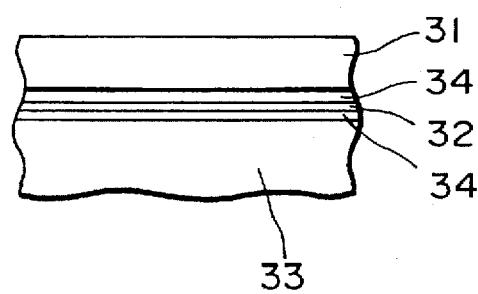
Figure 3:
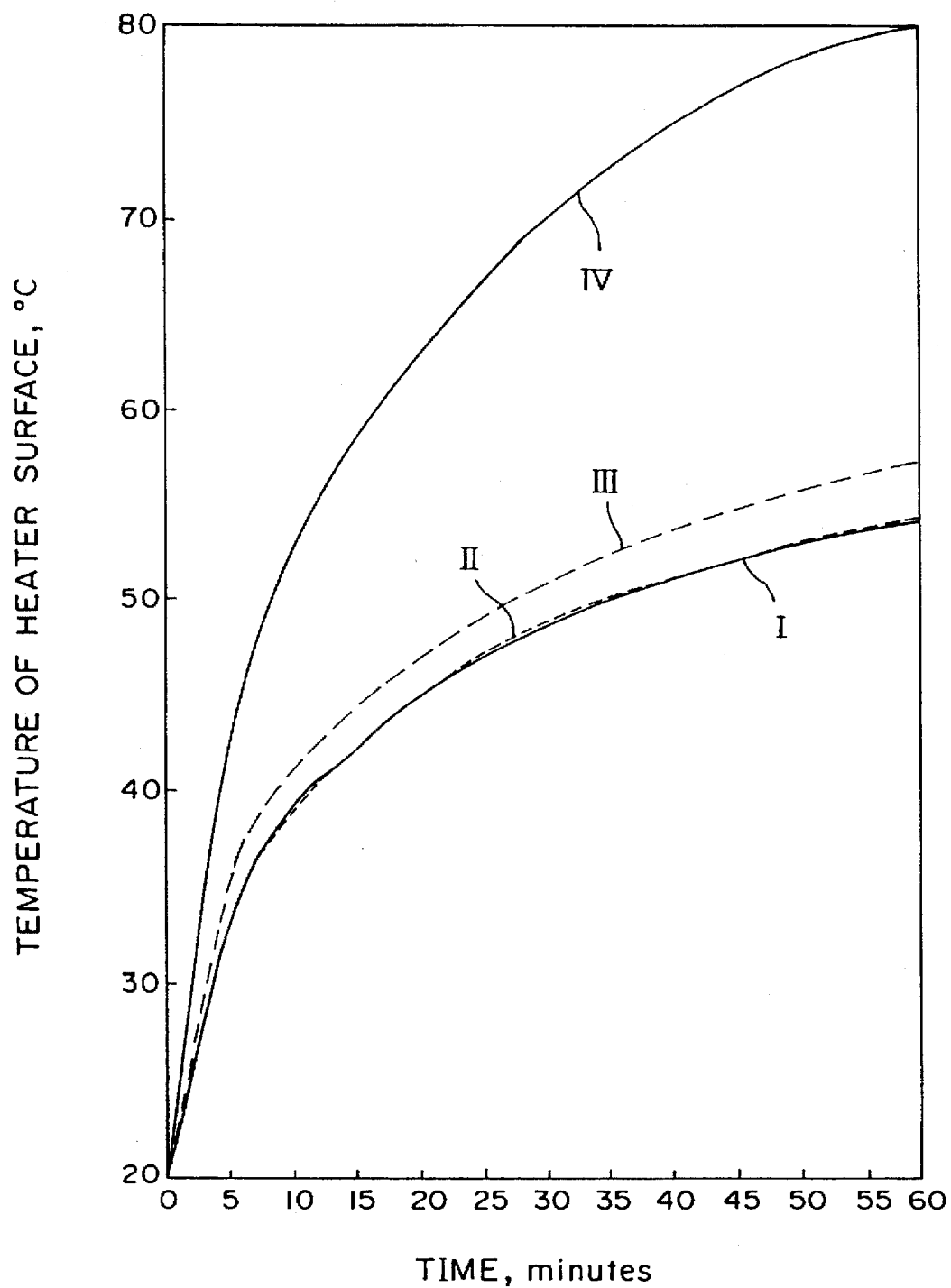
FIG. 3 is a graph showing increase in the surface temperature of a model heater as a function of the time from the start of testing by using the inventive heat-conductive sheet and by conventional methods.
Figure 4:
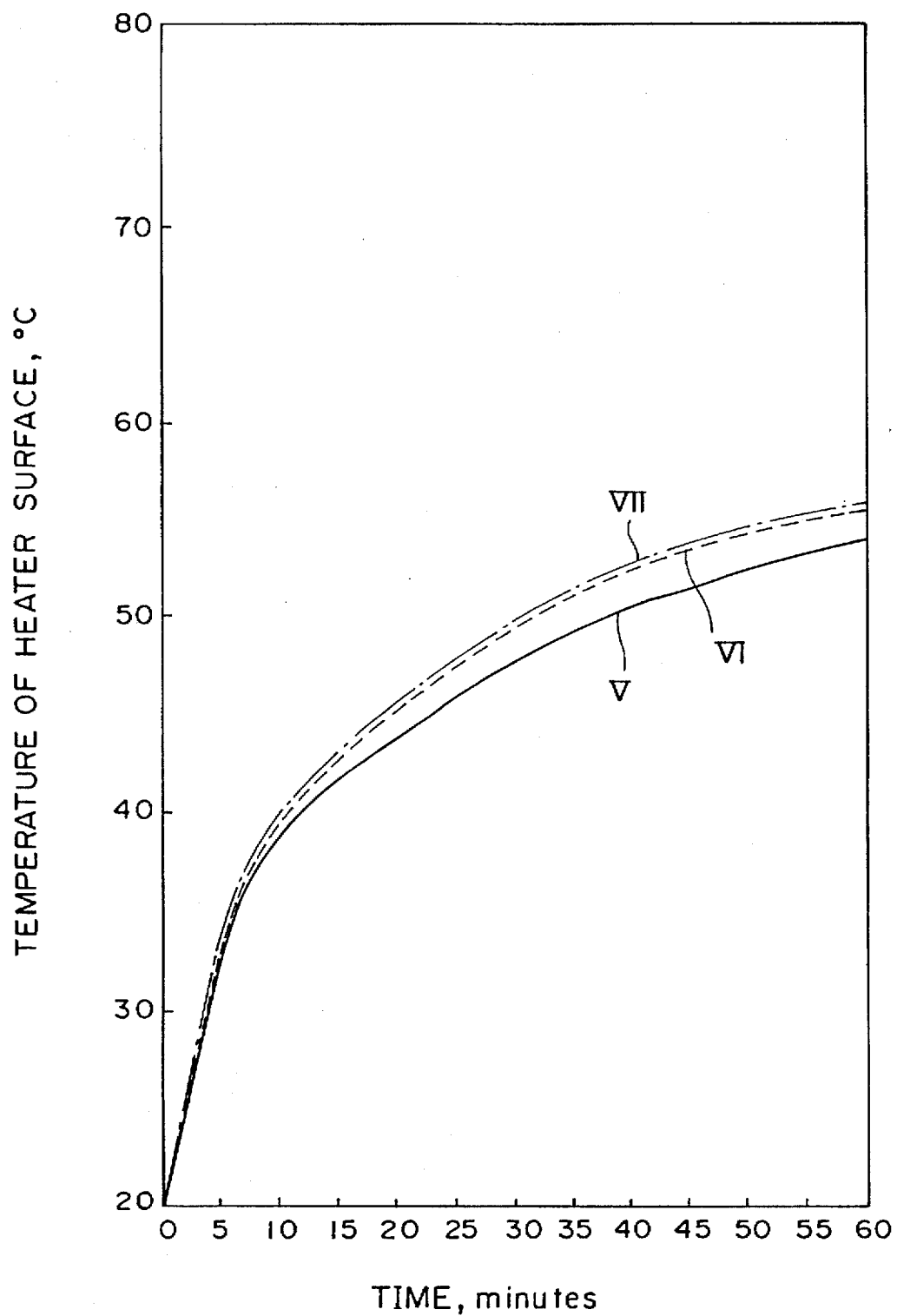
FIG. 4 is a graph showing increase in the surface temperature of a model heater as a function of the time from the start of testing using inventive heat-conducting sheets differing in thickness.

The heat-conductive sheet prepared in the same manner as in Example 1 was cut into square pieces of 50 mm by 50 mm wide and these pieces were subjected to the evaluation of the heat-conductive performance on the model heater testing instrument illustrated in FIGS. 2A and 2B to give the results shown in the graphs of FIGS. 3 and 4. FIG. 2B is an enlargement of the encircled part in FIG. 2A. The testing instrument had an electric heater 33 of 10 watts output on which the heat-conductive sheet 32 as the test sample and a heat sink member 31 are mounted successively with insertion of thermocouples 34,34 for the measurement of the surface temperatures of the heater 33 and the heat sink member 31.

FIG. 3 is a graph showing the temperature increase on the surface of the heater in the lapse of time. In FIG. 3, the curve I was obtained in the above mentioned test using the heat-conductive sheet according to the invention at an ambient temperature of 20° C. while the other curves were obtained for the purpose of comparison or control, of which curve II was obtained with a layer of a heat-conductive grease interposed between the surfaces of the heater 33 and heat sink member 31 in place of the heat-conductive sheet 32, curve III was obtained by mounting the heat sink member 31 in direct contact with the surface of the heater 33 and curve IV was obtained by keeping a 3 mm thick air gap between the surfaces of the heat sink member 31 and heater 33 without using a heat-conductive sheet.

FIG. 4 is a graph also showing the temperature increase of the heater surface in the same test as in FIG. 3 except that the overall thickness of the aluminum foil and the gelled deformable layer was varied. Namely, curves V, VI and VII were obtained with heat-conductive sheets having a thickness of 0.20 mm, 0.50 mm and 1.00 mm, respectively.

Application Example

Figure 5A:
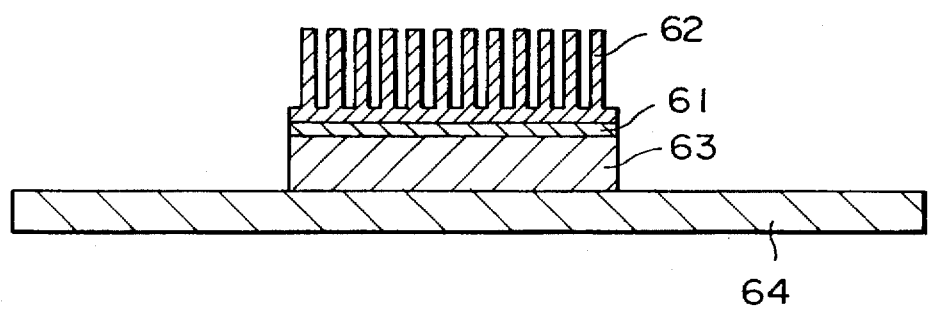
FIGS. 5A, 5B and 5C each illustrate an embodiment for the actual application of the inventive heat-conductive sheet by a vertical cross sectional view.
Figure 5B:
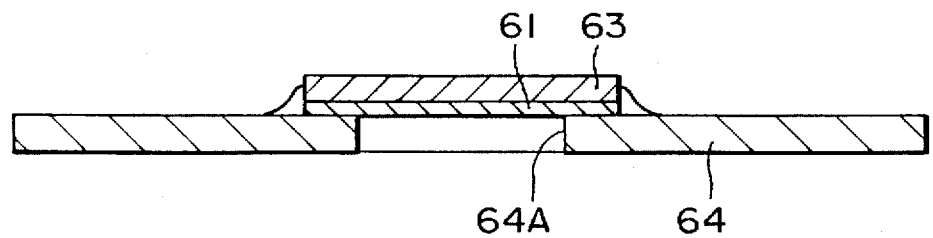
Figure 5C:
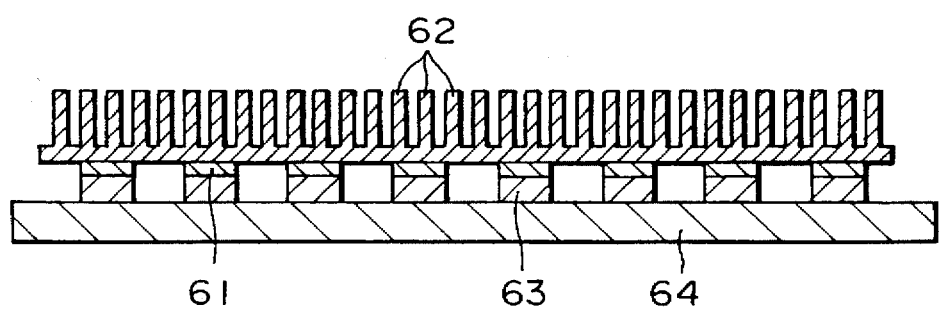

FIGS. 5A, 5B and 5C each illustrate a way for the application of the inventive heat-conductive sheet in mounting of an IC package 63 on a printed circuit board 64. In FIG. 5A, the IC package 63 is mounted directly on a printed circuit board 64 and a heat sink member 62 is mounted on the upper surface of the IC package 63 with intervention of the inventive heat-conductive sheet 61 so that the heat generated in the IC package 63 is efficiently transferred by conduction through the heat-conductive sheet 61 into the heat sink member 62 having fins to dissipate the heat to the ambience by radiator.

In FIG. 5B, the printed circuit board 64 is provided with an opening 64A and the IC package 63 is mounted on this opening 64A with intervention of the inventive heat-conductive sheet 61 so that the heat generated in the IC package 63 and transferred by conduction to the heat-conductive sheet 61 is dissipated from the surface thereof to the open atmosphere by radiation through the opening 64A.

FIG. 5C illustrates a further modified application of the inventive heat-conductive sheet, in which a single heat-conductive sheet 61 and a single heat sink member are mounted on a plurality of IC packages or other heat-generating devices 63,63 which in turn are mounted on a single printed circuit board 64.

What is claimed is:

1. A heat-conductive sheet which is a composite laminar body comprising:

(A) a substrate sheet made from a material having a heat conductivity of at least 0.001 calorie/cm·second·°C.; and (B) a deformable layer of a composite material having a thickness in the range from 0.005 to 1.0 mm formed on at least one surface of the substrate sheet, the composite material consisting of (a) a gelled organopolysioxane forming the matrix phase and (b) particles of a heat-conducting powder as the dispersed phase in the matrix phase and the composite material having a heat conductivity in the range from 0.001 to 0.005 calorie/cm·second·°C. and ¼-cone penetration in the range from 10 to 80 (×¹⁄₁₀ mm) at 25° C. according to JIS K 2220.

2. The heat-conductive sheet as claimed in claim 1 in which the substrate sheet is a foil of aluminum or an aluminum-based alloy.

3. The heat-conductive sheet as claimed in claim 2 in which the foil of aluminum or an aluminum-based alloy has a thickness in the range from 0.03 to 0.20 mm.

4. The heat-conductive sheet as claimed in claim 2 in which the aluminum-based alloy is selected from the alloys having a heat conductivity of at least 0.1 calorie/cm·second·°C.

5. The heat-conductive sheet as claimed in claim 1 in which the heat-conducting powder is selected from powders of alumina, titanium dioxide and boron nitride.

\* \* \* \* \*